US010410923B2

(12) United States Patent
Sandoh

(10) Patent No.: US 10,410,923 B2
(45) Date of Patent: Sep. 10, 2019

(54) METHOD OF PROCESSING WAFER

(71) Applicant: DISCO CORPORATION, Tokyo (JP)

(72) Inventor: Hideyuki Sandoh, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/706,137

(22) Filed: Sep. 15, 2017

(65) Prior Publication Data

US 2018/0076088 A1  Mar. 15, 2018

(30) Foreign Application Priority Data

Sep. 15, 2016 (JP) ................................. 2016-180912

(51) Int. Cl.

| | |
|---|---|
| *H01L 21/78* | (2006.01) |
| *H01L 21/304* | (2006.01) |
| *H01L 21/3065* | (2006.01) |
| *H01L 21/308* | (2006.01) |
| *H01L 21/3213* | (2006.01) |
| *H01L 21/683* | (2006.01) |

(52) U.S. Cl.
CPC ............ *H01L 21/78* (2013.01); *H01L 21/304* (2013.01); *H01L 21/308* (2013.01); *H01L 21/3065* (2013.01); *H01L 21/3083* (2013.01); *H01L 21/32136* (2013.01); *H01L 21/6836* (2013.01); *H01L 2221/68327* (2013.01)

(58) Field of Classification Search
CPC ................. H01L 21/78; H01L 21/3065; H01L 21/32136; H01L 21/6836; H01L 21/304; H01L 21/308
See application file for complete search history.

(56) References Cited

U.S. PATENT DOCUMENTS

| | | | | |
|---|---|---|---|---|
| 2004/0137702 | A1* | 7/2004 | Iijima | ..................... H01L 21/78 |
| | | | | 438/463 |
| 2006/0088983 | A1* | 4/2006 | Fujisawa | ........... H01L 21/67092 |
| | | | | 438/462 |
| 2006/0255431 | A1* | 11/2006 | Sekiya | ..................... H01L 22/34 |
| | | | | 257/620 |
| 2007/0264832 | A1* | 11/2007 | Arita | ................... H01L 21/6835 |
| | | | | 438/700 |

(Continued)

FOREIGN PATENT DOCUMENTS

JP  2006-114825  4/2006

*Primary Examiner* — Kyoung Lee
*Assistant Examiner* — Christina A Sylvia
(74) *Attorney, Agent, or Firm* — Greer Burns & Crain, Ltd.

(57) ABSTRACT

A method of processing a wafer includes forming a mask on portions of a face side of the wafer which correspond to devices; performing plasma etching on the face side of the wafer through the mask to etch areas of streets other than areas thereof corresponding to metal components, thereby forming grooves in the areas of the streets to a depth corresponding to a finished thickness of device chips; bonding a protective member for protecting the face side of the wafer, holding the face side of the wafer on a chuck table through the protective member and grinding a reverse side of the wafer until bottoms of the grooves are exposed, to fragmentize the wafer into the device chips; and picking up the device chips from the protective member, leaving remaining regions of the substrate which correspond to the metal components on the protective member.

4 Claims, 11 Drawing Sheets

(56) References Cited

U.S. PATENT DOCUMENTS

2009/0050885 A1* 2/2009 Cho ............... H01L 21/78
                                                257/48
2009/0121337 A1* 5/2009 Abe ............ B23K 26/0057
                                                257/686

* cited by examiner

METHOD OF PROCESSING WAFER

BACKGROUND OF THE INVENTION

Field of the Invention

The present invention relates to a method of processing a wafer to divide the wafer into device chips.

Description of the Related Art

Small and light electronic apparatuses, typically mobile phones, include as an indispensable component a device chip having an electronic circuit (device) such as an integrated circuit (IC) or the like. Device chips are manufactured by demarcating the surface of the substrate of a wafer made of silicon or the like into a plurality of areas with a plurality of projected dicing lines referred to as streets on the wafer, forming devices in the respective areas, and then dividing the wafers along the streets. It has been customary to divide a wafer by way of plasma etching in view of damage which would otherwise be caused to the substrate of the wafer (see, for example, Japanese Patent Laid-open No. 2006-114825).

SUMMARY OF THE INVENTION

On some wafers, metal components such as test patterns called test elements group (TEG) and/or dummy patterns may be disposed on streets. Plasma etching for processing substrates made of silicon or the like is unable to remove such metal components such as TEG, dummy patterns, etc. properly as they are hard to etch away. Providing plasma etching is utilized, therefore, the number of processing steps involved increases as metal components need to be removed before the plasma etching process.

It is therefore an object of the present invention to provide a method of processing a wafer to divide the wafer without an increase the number of processing steps involved regardless of metal components formed on streets on the wafer.

In accordance with an aspect of the present invention, there is provided a method of processing a wafer to divide the wafer along a grid-like pattern of streets thereon, the wafer having a plurality of devices formed in respective areas demarcated by the streets on a face side of a substrate, with metal components formed in areas overlapping the streets, including a mask forming step of forming a mask on portions of a face side of the wafer which correspond to the devices; a groove forming step of performing plasma etching on the face side of the wafer through the mask to etch areas of the streets other than areas thereof corresponding to the metal components after performing the mask forming step, thereby forming grooves in the areas of the streets to a depth corresponding to a finished thickness of device chips; a bonding step of bonding a protective member to the face side of the wafer after performing the groove forming step; a fragmentizing step of holding the face side of the wafer on a chuck table through the protective member and grinding a reverse side of the wafer until bottoms of the grooves are exposed, thereby to fragmentize the wafer into the device chips; and a pick-up step of picking up the device chips from the protective member, leaving remaining regions of the substrate which correspond to the metal components on the protective member.

In accordance with another aspect of the present invention, there is provided a method of processing a wafer to divide the wafer along a grid-like pattern of streets thereon, the wafer having a plurality of devices formed in respective areas demarcated by the streets on a face side of a substrate and a passivation film deposited on respective face sides of the devices, with metal components formed in areas overlapping the streets, including a groove forming step of performing plasma etching on the face side of the wafer through the passivation film used as a mask to etch areas of the streets other than areas thereof corresponding to the metal components, thereby forming grooves in the areas of the streets to a depth corresponding to a finished thickness of device chips; a bonding step of bonding a protective member to the face side of the wafer after performing the groove forming step; a fragmentizing step of holding the face side of the wafer on a chuck table through the protective member and grinding a reverse side of the wafer until bottoms of the grooves are exposed, thereby to fragmentize the wafer into the device chips; and a pick-up step of picking up the device chips from the protective member, leaving remaining regions of the substrate which correspond to the metal components on the protective member.

With the methods of processing a wafer according to the present invention, it is possible to divide a wafer that has metal components formed in streets into device chips without an increase in the number of processing steps.

The above and other objects, features and advantages of the present invention and the manner of realizing them will become more apparent, and the invention itself will best be understood from a study of the following description and appended claims with reference to the attached drawings depicting some preferred embodiments of the invention.

DETAILED DESCRIPTION OF THE PREFERRED EMBODIMENTS

Embodiments for carrying out the present invention will be described in detail below with reference to the accompanying drawings. The present invention is not limited to the details of the preferred embodiments described below. The components, steps, and other details described below should be interpreted as covering those which can easily be conjured up by those skilled in the art and those which are essentially identical or equivalent thereto. Furthermore, it is possible for features described below to be combined in appropriate ways. Various omissions, replacements, and modifications may be made in the embodiments without departing from the scope of the present invention.

First Embodiment

Figure 1:
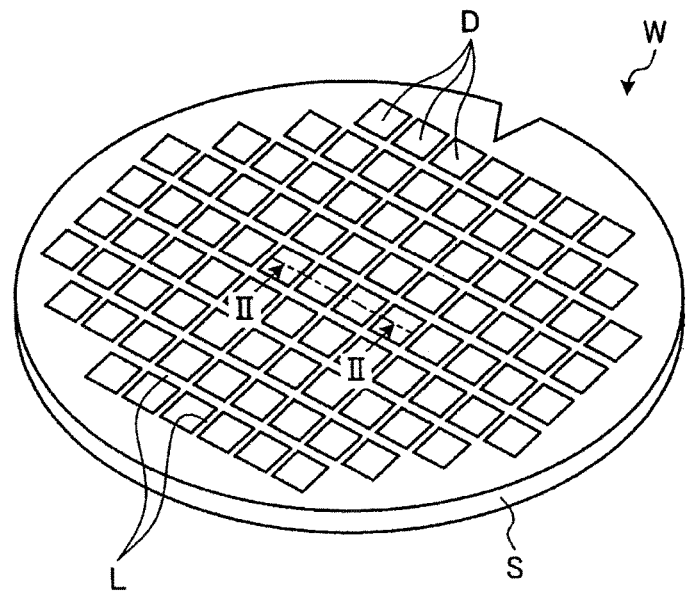
FIG. 1 is a perspective view of a wafer to be processed by a method of processing a wafer according to a first embodiment of the invention.
Figure 2:
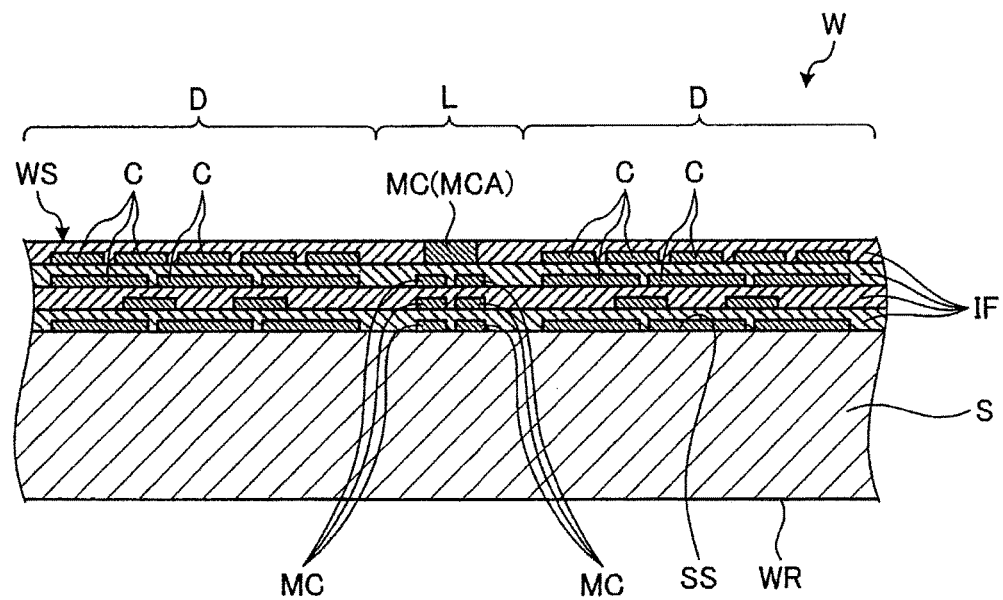
FIG. 2 is a cross-sectional view taken along line II-II of FIG. 1.

A method of processing a wafer (also referred to as "wafer processing method") according to a first embodiment of the present invention will be described below with reference to FIGS. 1 through 9. FIG. 1 is a perspective view of a wafer to be processed by the wafer processing method according to the first embodiment, and FIG. 2 is a cross-sectional view taken along line II-II of FIG. 1. The wafer processing method according to the first embodiment is a method of processing a wafer W depicted in FIG. 1. According to the first embodiment, the wafer W depicted in FIG. 1 refers to a disk-shaped semiconductor wafer or optical wafer having a substrate S made of silicon, sapphire, gallium arsenide, or the like. As depicted in FIG. 1, the wafer W has a plurality of devices D formed in respective areas on a face side SS of a substrate S thereof that are demarcated by a plurality of streets L that are arranged in a grid-like pattern. The devices D and the streets L have their faces on a face side WS of the wafer W, and the substrate S has a reverse side, opposite the face side SS thereof, on a reverse side WR of the wafer W.

According to the first embodiment, each of the streets L has a width up to several tens μm, each of the devices D has a rectangular shape of a size in the range from 0.1 to 20 mm on each side, and the wafer W should preferably be divided into the devices D by plasma etching. According to the first embodiment, the wafer W has a thickness in the range from 30 to 300 μm.

As depicted in FIG. 2, each of the devices D includes a plurality of insulating films IF made of an insulating material which is electrically insulative and a plurality of circuits C. The insulating films IF are deposited in stacked layers on the face side SS of the substrate S. The circuits C are disposed between the face side SS of the substrate S and the insulating films IF. The insulating films IF lie over and across the areas where the devices D are formed and the areas on the streets L. According to the first embodiment, each of the devices D may include a flash memory, for example.

The wafer W includes metal components MC in the areas overlapping the streets L. The metal components MC include TEG or dummy patterns used to polish the reverse side WR of the wafer W at the time the wafer W is polished by way of chemical mechanical polishing (CMP).

The metal components MC are disposed between the face side SS of the substrate S in the streets L and the insulating films IF in the streets L. Those metal components MC which are the remotest from the face side SS of the substrate S, i.e., those metal components which are denoted by MCA, are disposed in the uppermost insulating film IF and exposed outwardly. According to the first embodiment, the metal component MCA depicted in FIG. 2 is disposed centrally widthwise across the street L. However, the layout of the metal component MCA is not limited to the layout depicted in FIG. 2.

Figure 3:
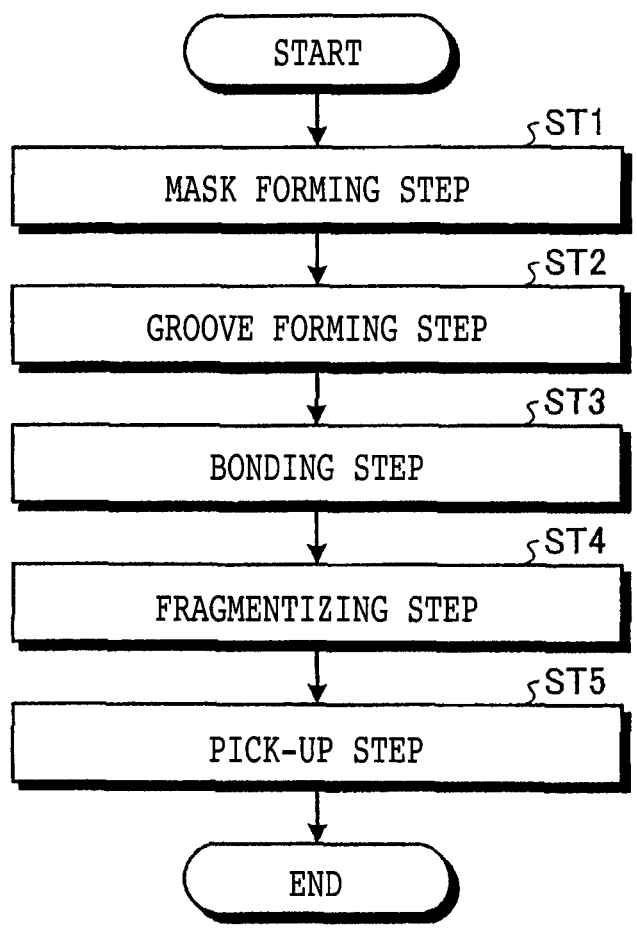
FIG. 3 is a flowchart of a sequence of the method of processing a wafer according to the first embodiment.
Figure 4:
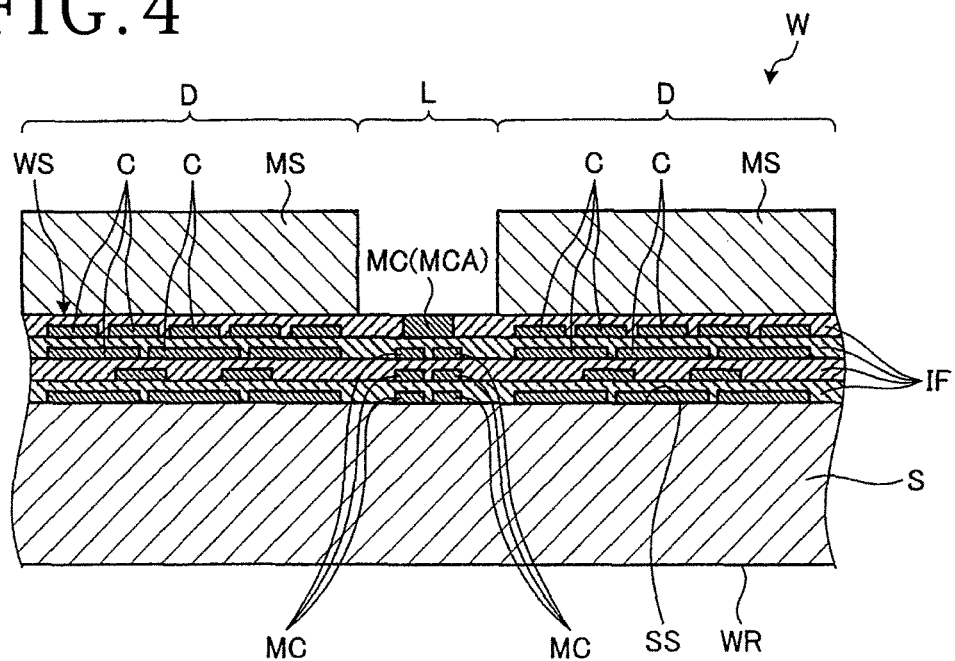
FIG. 4 is a cross-sectional view of a main part of the wafer, depicting a mask forming step of the method of processing a wafer depicted in FIG. 3.
Figure 5:
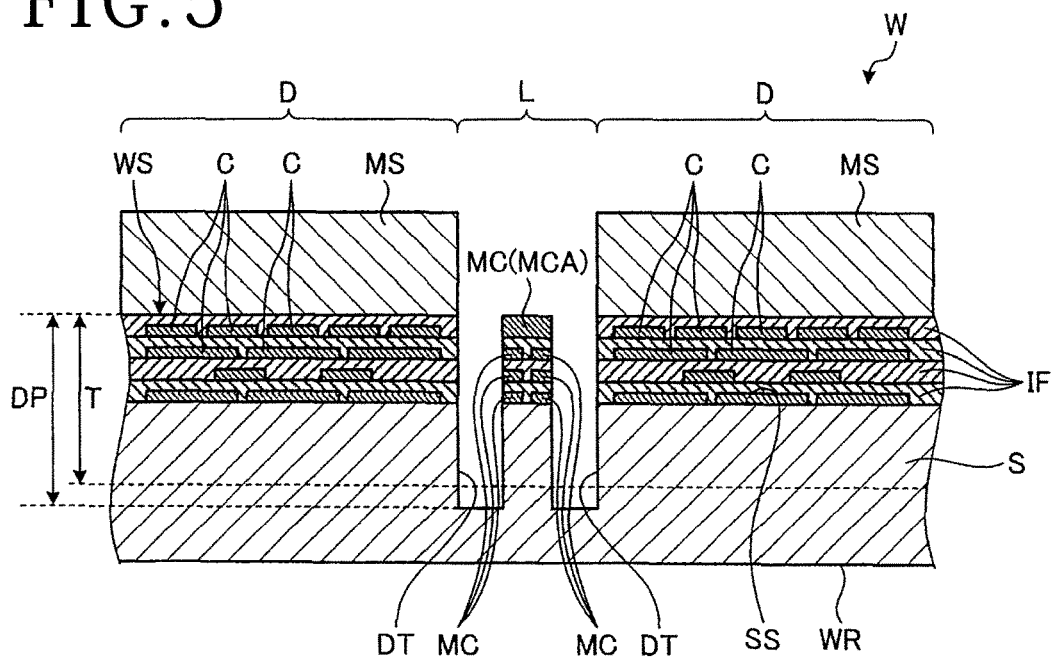
FIG. 5 is a cross-sectional view of the main part of the wafer, depicting a groove forming step of the method of processing a wafer depicted in FIG. 3.
Figure 6:
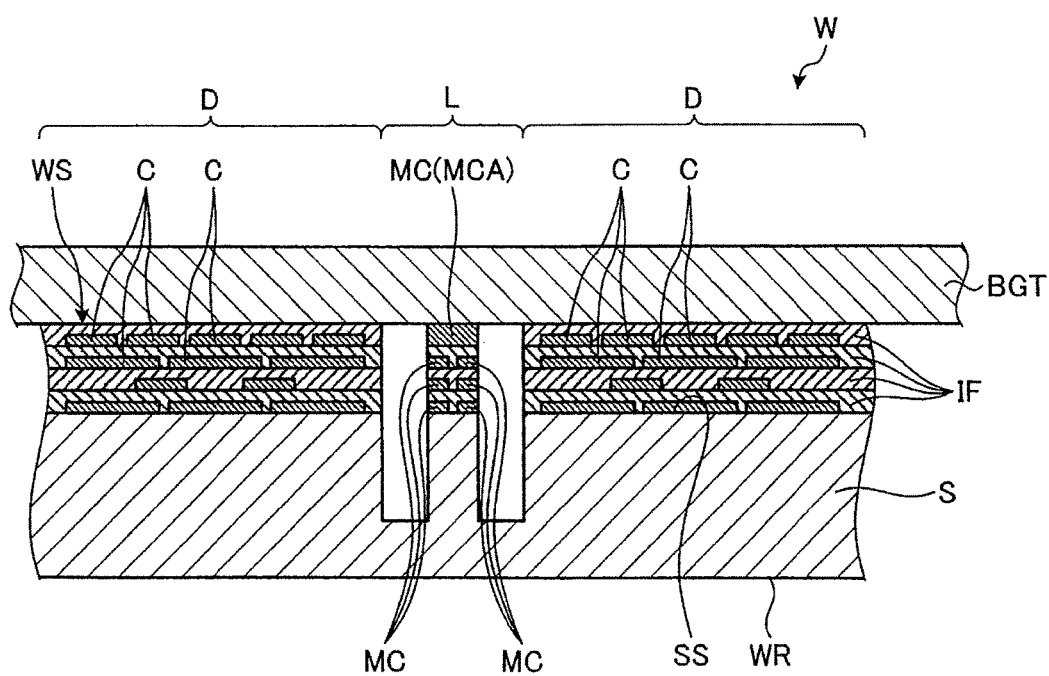
FIG. 6 is a cross-sectional view of the main part of the wafer, depicting a bonding step of the method of processing a wafer depicted in FIG. 3.

The wafer processing method according to the first embodiment will be described below with reference to the drawings. FIG. 3 is a flowchart of a sequence of the wafer processing method according to the first embodiment. The wafer processing method according to the first embodiment refers to a method of cutting the wafer W along the streets L to divide or fragmentize the wafer W into the devices D. As depicted in FIG. 3, the wafer processing method according to the first embodiment includes mask forming step ST1, groove forming step ST2, bonding step ST3, fragmentizing step ST4, and pick-up step ST5.

Mask forming step ST1 is a step of forming a mask MS that is resistant to plasma etching in the areas on the face side WS of the wafer W which correspond to the devices D. According to the first embodiment, mask forming step ST1 includes coating the entire face side WS of the wafer W with a positive or negative resist, and exposing the resist on the face sides of the streets L or the devices D to light and developing same, thereby forming a patterned mask MS on the face sides of the devices D. According to the present invention, the mask MS may be formed by coating the entire face side WS of the wafer W with a water-soluble resin including polyvinyl alcohol (PVA), polyvinyl pyrrolidone (PVP), or the like. After the entire face side WS of the wafer W has been coated with the water-soluble resin, the applied water-soluble resin may be removed from the streets L by an ablation process using a laser beam or a cutting process using a cutting blade, thus forming a mask MS on the face sides of the devices D.

Groove forming step ST2 is a step of performing plasma etching on the face side WS of the wafer W through the mask MS to etch the areas of the streets L other than the areas of the metal components MC and MCA to form grooves DT in the streets L to a depth DP corresponding to a finished thickness T (see FIG. 5) of the devices D. During groove forming step ST2, the wafer W is placed in a housing of an etching apparatus, not depicted, and the reverse side WR of the wafer W is attracted and held under electrostatic forces on an attractive holding member, i.e., an electrostatic chuck (ESC), on a lower electrode of the etching apparatus.

During groove forming step ST2, a coolant is circulated through a cooling channel defined in the lower electrode, an etching gas is introduced into the housing from an ejection port defined in an upper electrode of the etching apparatus, and high-frequency electric power is applied between the upper and lower electrodes to draw plasma ions to the wafer W, thereby etching the areas of the streets L that are exposed from the mask MS on the face side WS of the wafer W.

Since no mask MS is formed on the areas of the streets L of the wafer W, the insulating films IF in the streets L, except the metal components MC and MCA in the streets L, are etched away. Thereafter, the substrate S is etched from the face side WS to form the grooves DT in groove forming step ST2. For etching the substrate S in groove forming step ST2, plasma etching is performed according to the Bosch process. During groove forming step ST2, plasma etching is carried out until the depth DP of the grooves DT from the insulating film IF that is the remotest from the substrate S reaches at least the finished thickness T of the devices D.

Bonding step ST3 is a step of bonding a back grind (BG) tape BGT, which is a protective member for protecting the face side WS of the wafer W, to the face side WS of the wafer W. In bonding step ST3, the mask MS is removed by oxygen plasma ashing, and then the BG tape BGT is bonded to the face side WS of the wafer W from which the mask MS has been removed. If the mask MS is made of a water-soluble resin, then it may be removed by washing the face side WS side of the wafer W with pure water. The BG tape BGT that is bonded to the face side WS of the wafer W in bonding step ST3 may have an adhesive layer, not depicted, made of an adhesive whose adhesive power is lowered upon exposure to an ultraviolet radiation. Specifically, for example, the adhesive of the adhesive layer may include a substance that contains microcapsules or a foaming agent that can be expanded or foamed when irradiated with an ultraviolet radiation, or may include a substance that can be cured when irradiated with an ultraviolet radiation.

Figure 7:
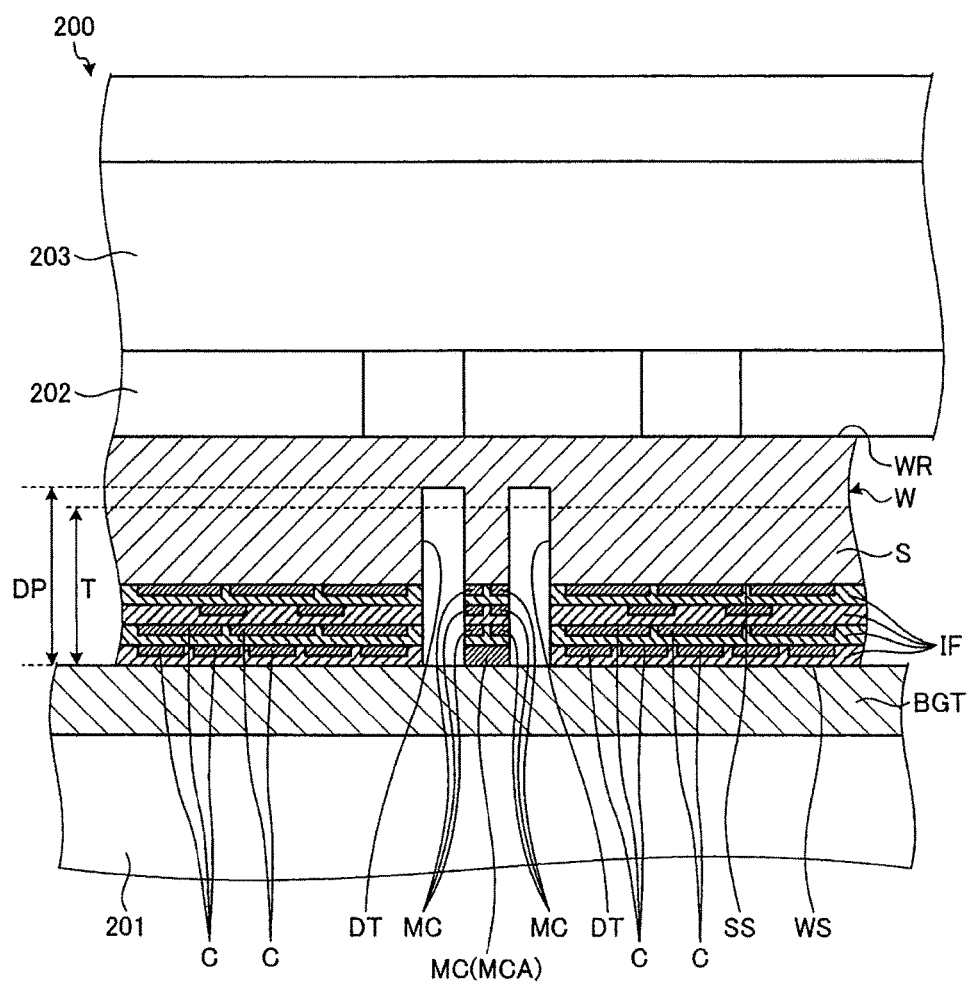
FIG. 7 is a cross-sectional view of the main part of the wafer, depicting a fragmentizing step of the method of processing a wafer depicted in FIG. 3.
Figure 8:
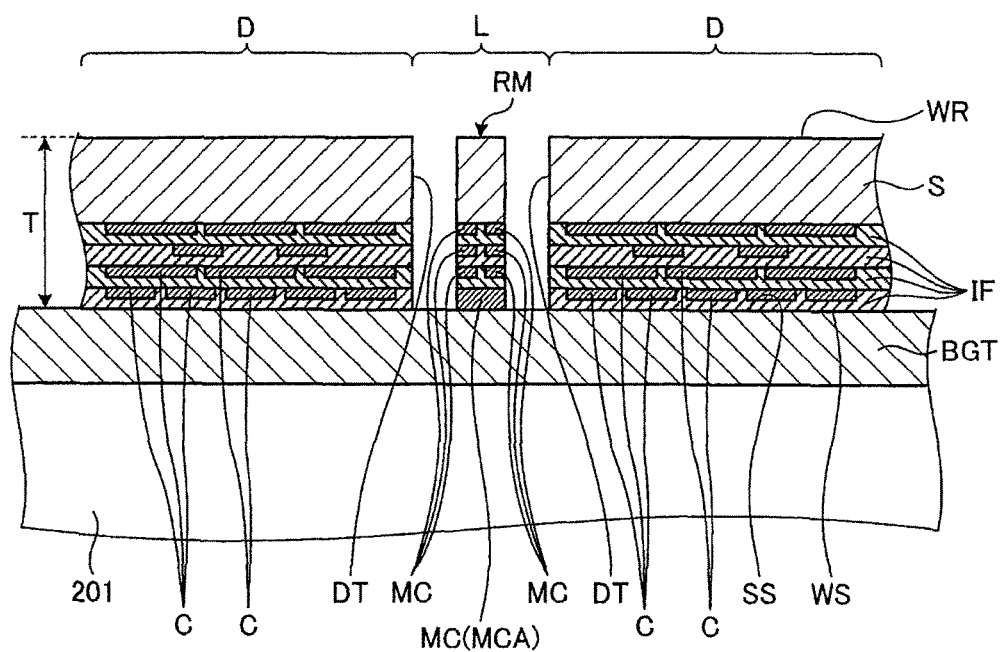
FIG. 8 is a cross-sectional view of the main part of the wafer after the fragmentizing step of the method of processing a wafer depicted in FIG. 3.
Figure 9:
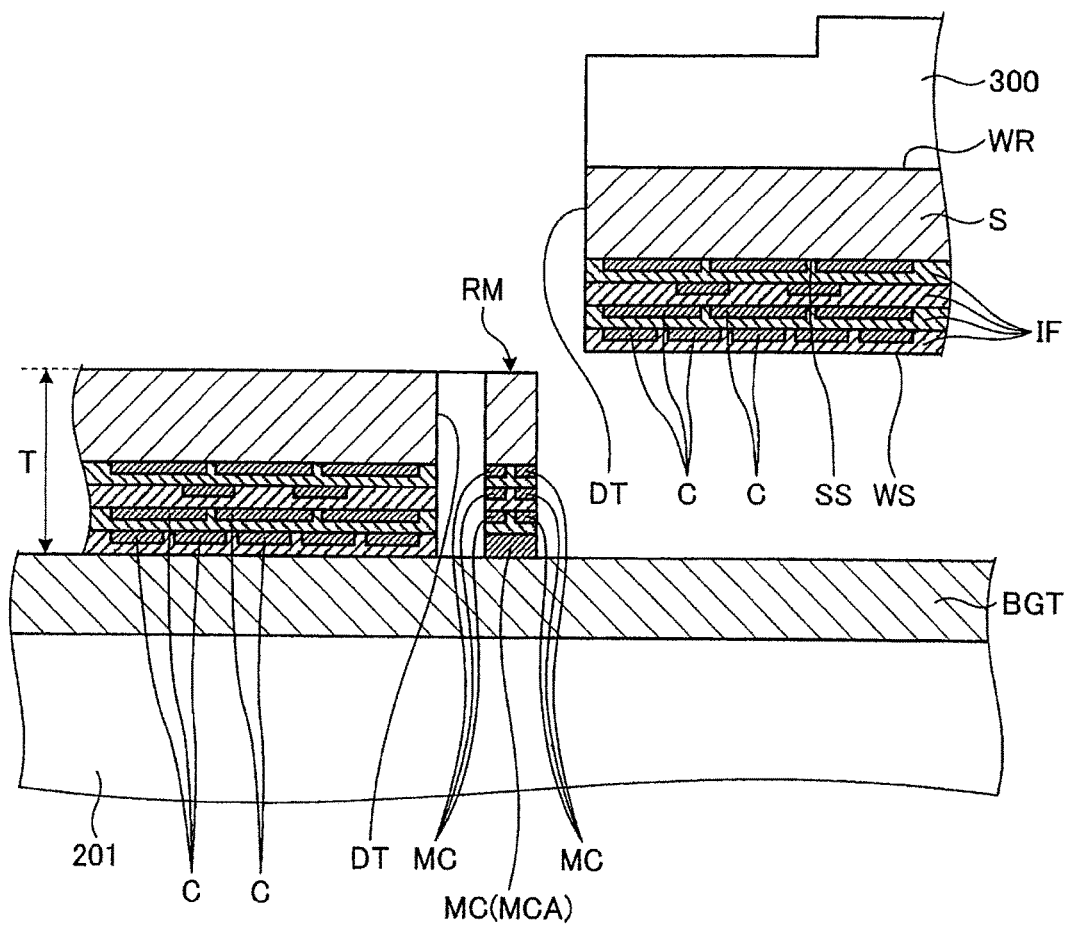
FIG. 9 is a cross-sectional view of the main part of the wafer, depicting a pick-up step of the method of processing a wafer depicted in FIG. 3.

Fragmentizing step ST4 is a step of holding the face side WS side of the wafer W through the BG tape BGT and grinding the reverse side WR of the wafer W until the bottoms of the grooves DT are exposed, thereby fragmentizing the wafer W. In fragmentizing step ST4, as depicted in FIG. 7, the face side WS side of the wafer W is held under suction on a chuck table 201 of a grinding apparatus 200 through the BG tape BGT, grinding stones 202 of a grinding wheel 203 of the grinding apparatus 200 are pressed against the reverse side WR of the wafer W, and the chuck table 201 and the grinding wheel 203 are rotated about their own axes relatively to each other to grind the wafer W to the finished thickness T with the grinding stones 202. When the wafer W is ground to the finished thickness T, the bottoms of the grooves DT are exposed on the reverse side WR side of the wafer W, dividing the wafer W into the devices D, as depicted in FIG. 8. In fragmentizing step ST4, after the wafer W has been ground by the grinding stones 202, the reverse side WR of the wafer W is polished by a polishing apparatus or a CMP apparatus. In fragmentizing step ST4, according to the present invention, a gettering layer may be formed on the reverse side WR of the wafer W, i.e., on the reverse sides WR of the respective devices D. The gettering layer refers to a layer containing crystalline defects, distortions, etc. (referred to as "gettering sites"), formed on the reverse side WR of the wafer W, i.e., on the reverse sides WR of the respective devices D. The gettering layer serves to trap metal impurity atoms conducive to metal contaminations in the gettering sites. After fragmentizing step ST4, residual regions RM are left between the devices D as depicted in FIG. 8. The residual regions RM include the metal components MC and MCA and correspond to the streets L.

Pick-up step ST5 is a step of picking up the devices D from the BG tape BGT, leaving on the BG tape BGT the residual regions RM (see FIG. 9) of the substrate S which include the metal components MC and MCA. In pick-up step ST5, an ultraviolet radiation is applied to the areas of the BG tape BGT which correspond to the areas where the devices D are disposed, thereby weakening the adhesive power of the BG tape BGT, and then the devices D are picked up from the BG tape BGT. Alternatively, no ultraviolet radiation may be applied to the portions of the adhesive layer of the BG tape BGT that are bonded to the streets L, but an ultraviolet radiation may be applied to the portions of the adhesive layer of the BG tape BGT that are bonded to the devices D. In pick-up step ST5, a pick-up unit 300 attracts the reverse sides WR of the devices D and pick them up one by one from the BG tape BGT, leaving the residual regions RM including the metal components MC and MCA in the streets L, bonded to the BG tape BGT.

With the wafer processing method according to the first embodiment, as described above, the grooves DT are formed, to a depth greater than the finished thickness T from the face side WS of the wafer W, in the streets L except for those portions where the metal components MC are provided, by way of plasma etching, and then the reverse side WR of the wafer W is ground to divide the wafer W into the individual devices D. The individual devices D are then picked up from the BG tape BGT, leaving the remaining regions RM bonded to the BG tape BGT. Therefore, the wafer processing method allows the wafer W with the metal components MC provided in the streets L to be divided into the individual devices D without the need for removing the metal components MC from the streets L in advance. As a result, according to the wafer processing method, the wafer W with the metal components MC provided in the streets L can be divided properly without an increase in the number of processing steps involved and also an increase in the cost.

Second Embodiment

Figure 10:
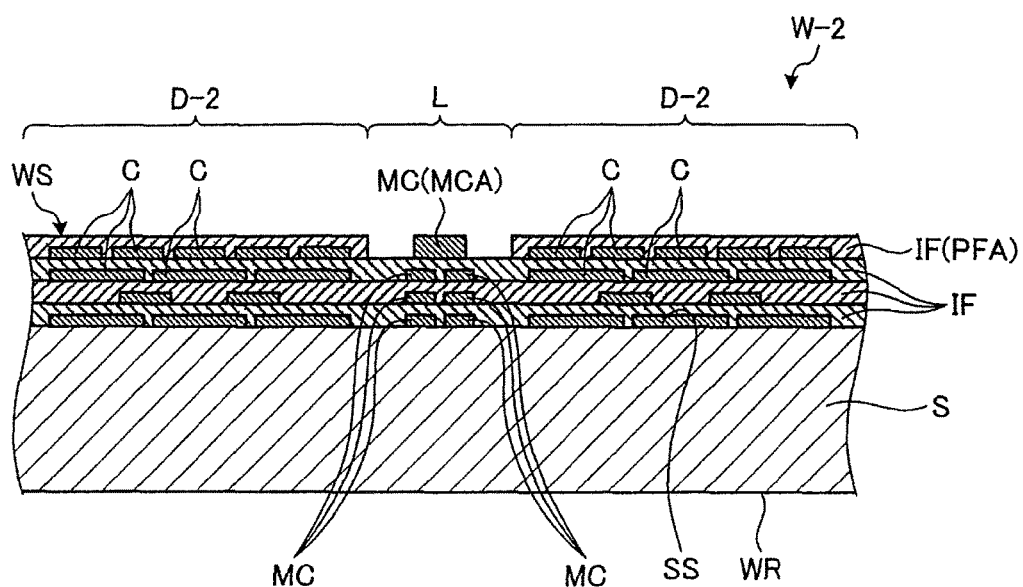
FIG. 10 is a cross-sectional view of a main part of a wafer to be processed by a method of processing a wafer according to a second embodiment of the invention.
Figure 11:
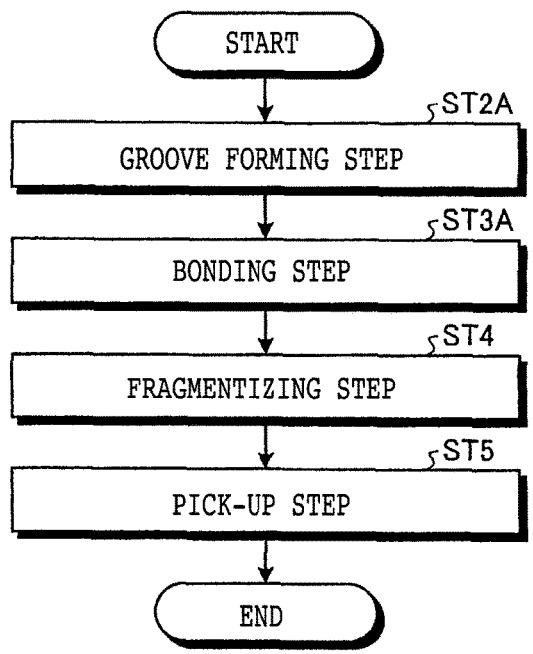
FIG. 11 is a flowchart of a sequence of the method of processing a wafer according to the second embodiment.
Figure 12:
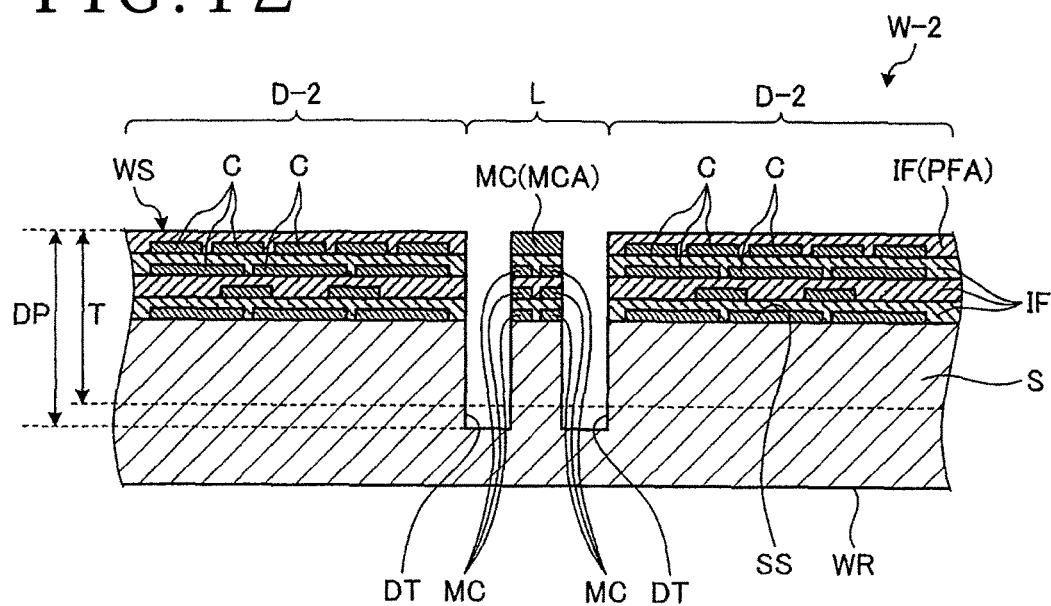
FIG. 12 is a cross-sectional view of the main part of the wafer, depicting a groove forming step of the method of processing a wafer depicted in FIG. 11.
Figure 13:
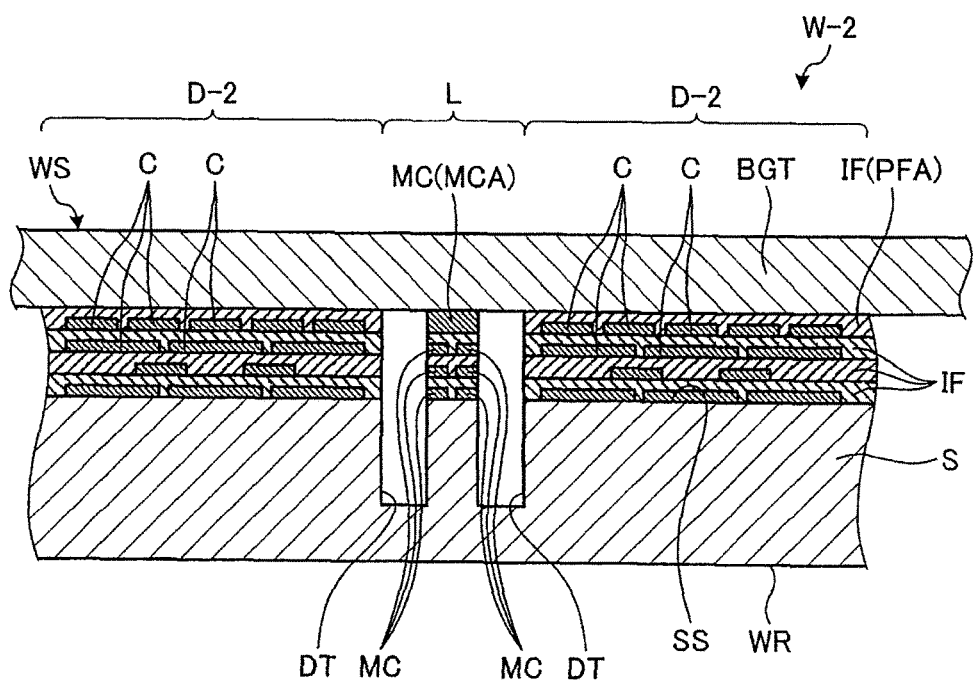
FIG. 13 is a cross-sectional view of the main part of the wafer, depicting a bonding step of the method of processing a wafer depicted in FIG. 11.

A method of processing a wafer (also referred to as "wafer processing method") according to a second embodiment of the present invention will be described below with reference to FIGS. 10 through 13. FIG. 10 is a cross-sectional view of a main part of a wafer to be processed by the wafer processing method according to the second embodiment. FIG. 11 is a flowchart of a sequence of the wafer processing method according to the second embodiment. The wafer processing method according to the second embodiment is a method of processing a wafer W-2 depicted in FIG. 10. According to the second embodiment, as depicted in FIG. 10, the wafer W-2 has devices D-2 each including a plurality of circuits C and a plurality of dielectric films IF deposited in covering relation to the circuits C. The dielectric films IF are deposited in stacked layers on the face side SS of the substrate S. The circuits C are disposed between the face side SS of the substrate S and the dielectric films IF. Of the dielectric films IF, the dielectric film IF that is the remotest from the face side SS of the substrate S serves as a passivation film PFA in the outermost layer, and is not formed in, i.e., removed from, the areas of the streets L.

The passivation film PFA is deposited over the substrate S to protect the circuits C from the exterior environment and protect the circuits C physically and chemically. The passivation film PFA includes a silicon oxide ($SiO_2$) film, a silicon nitride ($Si_3N_4$) film, or the like which is plasma-resistant. The streets L are free of the passivation film PFA, as described above, but include metal components MCA.

The wafer processing method according to the second embodiment refers to a method of cutting the wafer W-2 along the streets L to divide or fragmentize the wafer W-2 into the devices D-2. As depicted in FIG. 11, the wafer processing method according to the second embodiment includes groove forming step ST2A, bonding step ST3A, fragmentizing step ST4, and pick-up step ST5. Groove forming step ST2A and bonding step ST3A of the wafer processing method according to the second embodiment are different from those of the wafer processing method according to the first embodiment, and fragmentizing step ST4 and pick-up step ST5 of the wafer processing method according to the second embodiment are the same as those of the wafer processing method according to the first embodiment.

Groove forming step ST2A is a step of performing plasma etching on the face side WS of the wafer W-2 through the passivation film PFA used as a mask to etch the areas of the streets L other than the areas of the metal components MC and MCA to form grooves DT in the streets L to a depth DP corresponding to at least a finished thickness T (see FIG. 12) of the devices D-2. During groove forming step ST2A, as with groove forming step ST2 according to the first embodiment, the wafer W-2 is placed in a housing of an etching apparatus, not depicted, and the areas of the streets L are etched using the passivation film PFA as a mask.

Since no passivation film PFA is formed on the areas of the streets L of the wafer W-2, the dielectric films IF in the streets L, except the metal components MC and MCA in the streets L, are etched away. Thereafter, the substrate S is etched from the face side WS to form the grooves DT in groove forming step ST2A. For etching the substrate S in groove forming step ST2A, plasma etching is performed according to the Bosch process. During groove forming step ST2A, plasma etching is carried out until the depth DP of the grooves DT from the surface of the passivation film PFA reaches at least the finished thickness T of the devices D.

Bonding step ST3A is a step of bonding a BG tape BGT, which is a protective member for protecting the face side WS of the wafer W-2, to the face side WS of the wafer W-2. In bonding step ST3A, the BG tape BGT is bonded to the face side WS of the wafer W-2 on which groove forming step ST2 has been carried out. In the wafer processing method according to the second embodiment, fragmentizing step ST4 and pick-up step ST5 are successively carried out after bonding step ST3A, as with the wafer processing method according to the first embodiment.

With the wafer processing method according to the second embodiment, as described above, the grooves DT are formed, to a depth equal to or greater than the finished thickness T from the face side WS of the wafer W-2, in the streets L except for those portions where the metal components MC are provided, by way of plasma etching, and then the reverse side WR of the wafer W-2 is ground to divide the wafer W-2 into the individual devices D-2. The individual devices D-2 are then picked up from the BG tape BGT, leaving the remaining regions RM bonded to the BG tape BGT. Therefore, the wafer processing method according to the second embodiment allows the wafer W-2 with the metal components MC provided in the streets L to be divided into the individual devices D-2 without the need for removing the metal components MC from the streets L in advance. As a result, according to the wafer processing method, the wafer W-2 with the metal components MC provided in the streets L can be divided properly without an increase in the number of processing steps involved and also an increase in the cost.

With the wafer processing method according to the second embodiment, furthermore, inasmuch as plasma etching is performed through the passivation film PFA used as a mask, it is not necessary to deposit another mask for plasma etching. Therefore, the wafer W-2 can be divided into the devices D-2 without an increase in the number of processing steps involved and also an increase in the cost. In view of the first and second embodiments described above, the present invention covers a method of processing a wafer added as Appendix given below, and also covers methods of manufacturing devices which include the wafer processing methods according to the above embodiments.

Appendix 1

A method of processing a wafer to divide the wafer along a grid-like pattern of streets thereon, the wafer having a plurality of devices formed in respective areas demarcated by the streets on a face side of a substrate, with metal components formed in areas overlapping the streets, including:

a fragmentizing step of holding a face side of the wafer in which plasma etching has been performed on the face side of the wafer to etch the areas of the streets other than the areas thereof which correspond to the metal components, thereby forming grooves in the streets to a depth corresponding to a finished thickness of device chips, and grinding a reverse side of the wafer until bottoms of the grooves are exposed thereby to fragmentize the wafer; and a pick-up step of picking up the devices, leaving remaining regions of the substrate which correspond to the metal components.

Modifications

Figure 14:
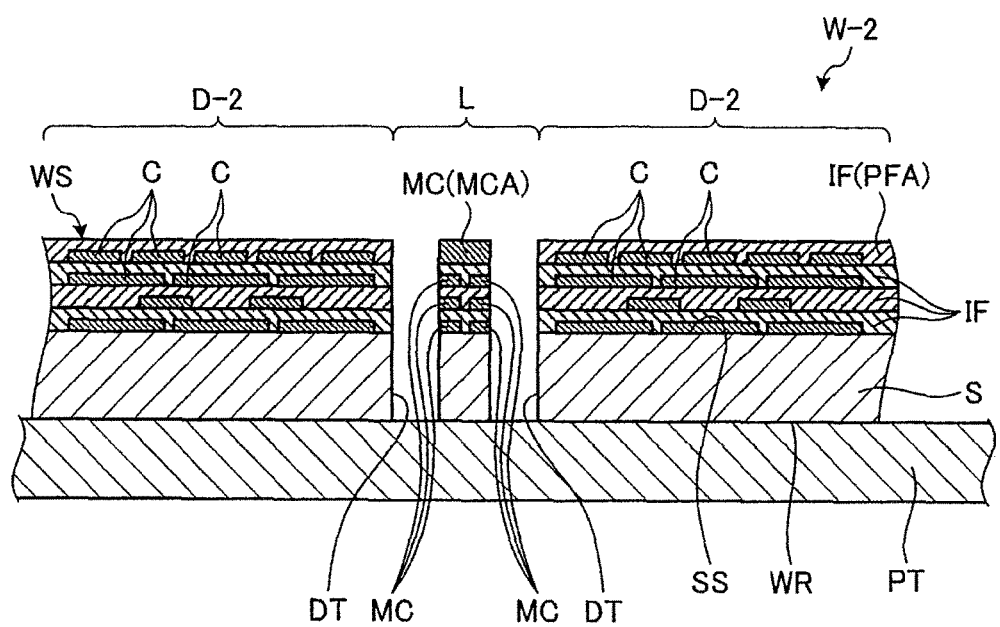
FIG. 14 is a cross-sectional view of a main part of a wafer before a pick-up step of a method of processing a wafer according to a modification of each of the embodiments.
Figure 15:
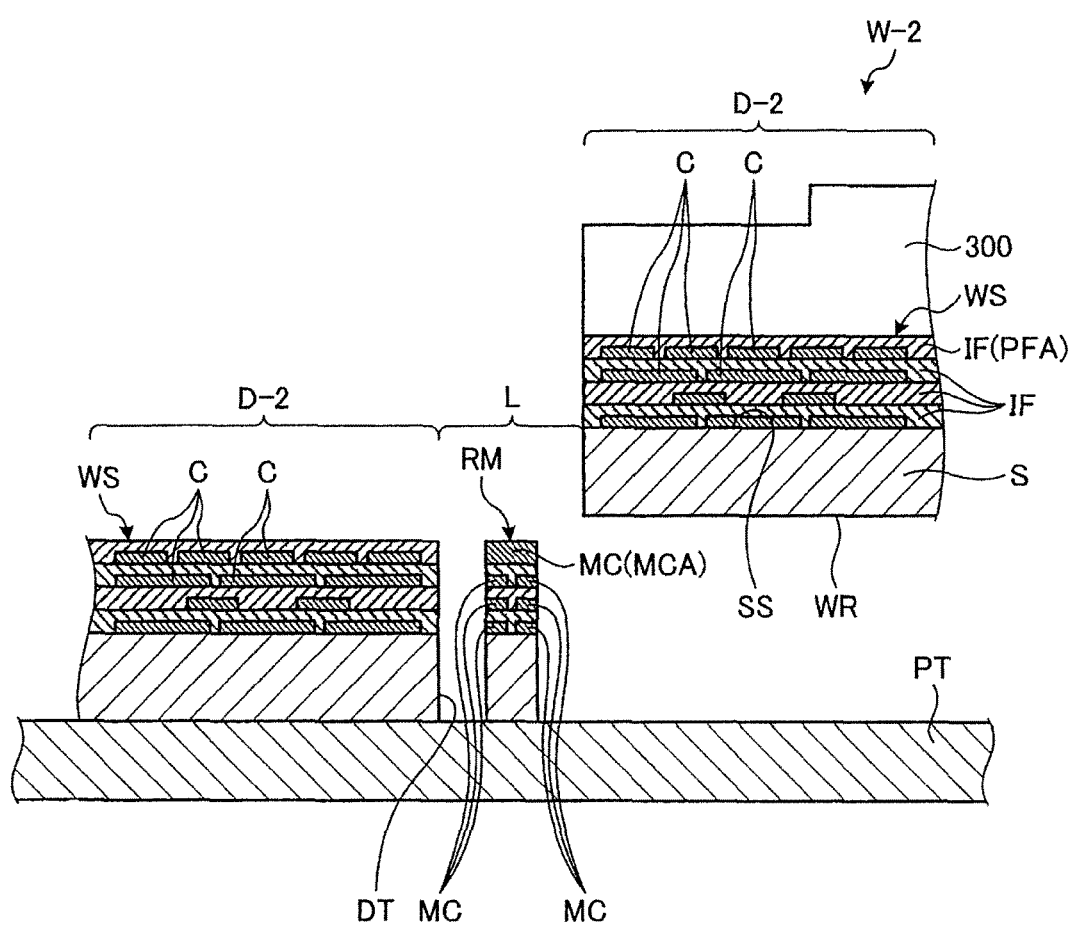
FIG. 15 is a cross-sectional view of the main part of the wafer, depicting the pick-up step of the method of processing a wafer according to the modification of each of the embodiments.

A method of processing a wafer according to a modification of each of the embodiments will be described below with reference to the drawings. FIG. 14 is a cross-sectional view of a main part of a wafer before a pick-up step of the method of processing a wafer according to the modification of each of the embodiments. FIG. 15 is a cross-sectional view of the main part of the wafer, depicting the pick-up step of the method of processing a wafer according to the modification of each of the embodiments. Those parts depicted in FIGS. 14 and 15 which are identical to those according to the first and second embodiments are denoted by identical reference characters, and will not be described in detail below. FIGS. 14 and 15 illustrate a modification of the second embodiment by way of example, though the modification is also applicable to the first embodiment.

The method of processing a wafer (hereinafter also referred to as "wafer processing method") according to the modification of each of the first and second embodiments is similar to the wafer processing methods according to the first and second embodiments except for pick-up step ST5.

In pick-up step ST5 of the wafer processing method according to the modification of each of the embodiments, as depicted in FIG. 14, a protective tape PT that is permeable with an ultraviolet radiation is bonded to the reverse side WR of the wafer W on which fragmentizing step ST4 has been performed, and the overall adhesive layer of the BG tape BGT is irradiated with an ultraviolet radiation, after which the BG tape BGT is peeled off from the face side WS of the wafer W. In other words, in pick-up step ST5 of the wafer processing method according to the modification of each of the embodiments, the BG tape BGT is taken over by or replaced with the protective tape PT. The protective tape PT includes an adhesive layer made of an adhesive whose adhesive power is lowered upon exposure to an ultraviolet radiation, as with the adhesive of the BG tape BGT.

In pick-up step ST5 of the wafer processing method according to the modification, no ultraviolet radiation is applied to the portions of the adhesive layer of the protective tape PT that are bonded to the streets L, but an ultraviolet radiation is applied to the portions of the adhesive layer of the protective tape PT that are bonded to the devices D. In pick-up step ST5, a pick-up unit 300 (see FIG. 15) attracts the face sides WS of the devices D and pick them up one by one from the protective tape PT, leaving the residual regions RM including the metal components MC and MCA in the streets L, bonded to the protective tape PT. Alternatively, in pick-up step ST5 of the wafer processing method according to the modification, the protective film PT in its entirety may be irradiated with an ultraviolet radiation, and only the devices D may be picked up, leaving the residual regions RM on the protective film PT.

In the pick-up step of the wafer processing method according to the modification, furthermore, when the BG tape BGT is replaced with the protective tape PT, the portions of the adhesive layer of the BG tape BGT to which the remaining regions RM are bonded may not be irradiated with an ultraviolet radiation, and the remaining regions RM which include the metal components MC and MCA in the streets L may be left on the BG tape BGT.

With the pick-up step of the wafer processing method according to the modification, as with the first and second embodiments, the grooves DT are formed, to a depth DP greater than the finished thickness T from the face side WS of the wafer W, in the streets L except for those portions where the metal components MC are provided, by way of plasma etching, and then the reverse side WR of the wafer W is ground to divide the wafer W into the individual devices D. Accordingly, the wafer processing method allows the wafer W with the metal components MC provided in the streets L to be divided into the individual devices D without the need for removing the metal components MC from the streets L in advance.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a wafer to divide the wafer along a grid-like pattern of streets thereon, the wafer having a plurality of devices formed in respective areas demarcated by the streets on a face side of a substrate, with metal components formed in areas overlapping the streets, comprising:
    a mask forming step of forming a mask on portions of a face side of the wafer which correspond to the devices;
    a groove forming step of performing plasma etching on the face side of the wafer through the mask to etch areas of the streets other than areas thereof corresponding to the metal components after performing the mask forming step, thereby forming two grooves in each of the streets having metal components to a depth corresponding to a finished thickness of device chips;
    a bonding step of bonding a protective member to the face side of the wafer after performing the groove forming step;
    a fragmentizing step of holding the face side of the wafer on a chuck table through the protective member and grinding a reverse side of the wafer until bottoms of the grooves are exposed, thereby to fragmentize the wafer into the device chips; and
    a pick-up step of picking up the device chips from the protective member, leaving remaining regions of the substrate which correspond to the metal components on the protective member,
    wherein, between the groove forming step and the fragmentizing step, the metal components remain on parts of the substrate between the two grooves in the streets.

2. A method of processing a wafer to divide the wafer along a grid-like pattern of streets thereon, the wafer having a plurality of devices formed in respective areas demarcated by the streets on a face side of a substrate and a passivation film deposited on respective face sides of the devices, with metal components formed in areas overlapping the streets, comprising:
    a groove forming step of performing plasma etching on the face side of the wafer through the passivation film used as a mask to etch areas of the streets other than areas thereof corresponding to the metal components, thereby forming two grooves in each of the streets having metal components to a depth corresponding to a finished thickness of device chips;
    a bonding step of bonding a protective member to the face side of the wafer after performing the groove forming step;
    a fragmentizing step of holding the face side of the wafer on a chuck table through the protective member and grinding a reverse side of the wafer until bottoms of the grooves are exposed, thereby to fragmentize the wafer into the device chips; and
    a pick-up step of picking up the device chips from the protective member, leaving remaining regions of the substrate which correspond to the metal components on the protective member,
    wherein, between the groove forming step and the fragmentizing step, the metal components remain on parts of the substrate between the two grooves in the streets.

3. A method of processing a wafer to divide the wafer along a grid-like pattern of streets thereon, the wafer having a plurality of devices formed in respective areas demarcated by the streets on a face side of a substrate, with metal components formed in areas overlapping the streets, comprising:
    a mask forming step of forming a mask on portions of a face side of the wafer which correspond to the devices;
    a groove forming step of performing plasma etching on the face side of the wafer through the mask to etch areas of the streets other than areas thereof corresponding to the metal components after performing the mask forming step, thereby forming two grooves in each of the streets having metal components to a depth corresponding to a finished thickness of device chips;
    a bonding step of bonding a protective member to the face side of the wafer after performing the groove forming step;
    a fragmentizing step of holding the face side of the wafer on a chuck table through the protective member and grinding a reverse side of the wafer until bottoms of the grooves are exposed, thereby to fragmentize the wafer into the device chips; and
    a pick-up step of picking up the device chips from the protective member, leaving remaining regions of the substrate which correspond to the metal components on the protective member,
    wherein:
    the wafer includes a substrate and a plurality of insulating films and a plurality of circuits, wherein the insulating films and the circuits are provided on the face side of the substrate; and
    the two grooves formed in each of the streets during the groove forming step extend into the substrate.

4. A method of processing a wafer to divide the wafer along a grid-like pattern of streets thereon, the wafer having a plurality of devices formed in respective areas demarcated by the streets on a face side of a substrate and a passivation film deposited on respective face sides of the devices, with metal components formed in areas overlapping the streets, comprising:

a groove forming step of performing plasma etching on the face side of the wafer through the passivation film used as a mask to etch areas of the streets other than areas thereof corresponding to the metal components, thereby forming two grooves in each of the streets having metal components to a depth corresponding to a finished thickness of device chips;

a bonding step of bonding a protective member to the face side of the wafer after performing the groove forming step;

a fragmentizing step of holding the face side of the wafer on a chuck table through the protective member and grinding a reverse side of the wafer until bottoms of the grooves are exposed, thereby to fragmentize the wafer into the device chips; and a pick-up step of picking up the device chips from the protective member, leaving remaining regions of the substrate which correspond to the metal components on the protective member, wherein:

the wafer includes a substrate and a plurality of insulating films and a plurality of circuits, wherein the insulating films and the circuits are provided on the face side of the substrate; and the two grooves formed in each of the streets during the groove forming step extend into the substrate.

* * * * *